(12) United States Patent
Takamatsu et al.

(10) Patent No.: US 7,036,801 B2
(45) Date of Patent: May 2, 2006

(54) VAPORIZER AND APPARATUS FOR VAPORIZING AND SUPPLYING

(75) Inventors: Yukichi Takamatsu, Kanagawa (JP); Kazuaki Tonari, Kanagawa (JP); Mitsuhiro Iwata, Kanagawa (JP); Koji Kiriyama, Kanagawa (JP); Akira Asano, Kanagawa (JP)

(73) Assignee: Japan Pionics Co., Ltd., Tokyo (JP)

( * ) Notice: Subject to any disclaimer, the term of this patent is extended or adjusted under 35 U.S.C. 154(b) by 273 days.

(21) Appl. No.: 10/413,204

(22) Filed: Apr. 15, 2003

(65) Prior Publication Data

US 2003/0209201 A1    Nov. 13, 2003

(30) Foreign Application Priority Data

May 13, 2002    (JP) .............................. 2002-136892

(51) Int. Cl.
*B01F 3/04*    (2006.01)
(52) U.S. Cl. .............. 261/142; 261/78.2; 261/DIG. 65; 118/726
(58) Field of Classification Search ................ 261/27, 261/28, 62, 66, 76, 78.2, 142, DIG. 65; 118/726
See application file for complete search history.

(56) References Cited

U.S. PATENT DOCUMENTS

| | | | | |
|---|---|---|---|---|
| 4,271,099 A | * | 6/1981 | Kukla ........................... | 261/76 |
| 4,370,304 A | * | 1/1983 | Hendriks et al. ............ | 422/224 |
| 4,379,097 A | * | 4/1983 | Leggett ...................... | 261/78.2 |
| 4,977,785 A | * | 12/1990 | Willoughby et al. ..... | 73/863.12 |
| 5,372,754 A | * | 12/1994 | Ono ............................. | 261/142 |
| 5,437,784 A | * | 8/1995 | Meinecke et al. .......... | 209/170 |
| 5,901,908 A | * | 5/1999 | Goenka et al. ............. | 239/432 |
| 6,110,283 A | * | 8/2000 | Yamamuka et al. ........ | 118/715 |
| 6,155,540 A | * | 12/2000 | Takamatsu et al. ........ | 261/78.2 |
| 6,195,504 B1 | * | 2/2001 | Horie et al. ................ | 392/394 |
| 6,349,887 B1 | * | 2/2002 | Pyo ............................. | 239/137 |
| 6,386,466 B1 | * | 5/2002 | Ozawa et al. ............... | 239/433 |
| 6,473,563 B1 | | 10/2002 | Takamatsu et al. | |
| 2002/0043215 A1 | * | 4/2002 | Yoshioka et al. ........... | 118/715 |

* cited by examiner

*Primary Examiner*—Scott Bushey
(74) *Attorney, Agent, or Firm*—Oblon, Spivak, McClelland, Maier & Neustadt, P.C.

(57) ABSTRACT

The present invention provides a vaporizer having a vaporization chamber for a CVD material, a CVD material feed portion supplying the CVD material for the vaporization chamber, a vaporized gas exhaust port and a heater for heating the vaporization chamber, wherein the CVD material feed portion has passageways for the CVD material and for a carrier gas respectively, and the passageway for the CVD material has a pressure loss inducer for the CVD material. At the same time, the present invention provides an apparatus for vaporizing and supplying that feeds a CVD material to a vaporizer via a liquid flow controller, and after vaporizing the CVD material that supplies the vaporized gas for a semiconductor production apparatus having a pressure loss-inducer for the CVD material between the liquid flow controller and the vaporizer. According to the present invention, even in the case of vaporizing and supplying with a decrease in a feed amount of a carrier gas to be supplied accompanying the CVD material employing a solid CVD material, reducing and stabilizing both the pressure fluctuation in the vaporizer and the flow rate fluctuation in the liquid flow controller and efficiently vaporizing a CVD material at a desirable concentration and flow rate without causing deposit or adhesion of the solid material in the vaporization chamber can be achieved.

2 Claims, 5 Drawing Sheets

(1)

(2)

(1)          (2)

VAPORIZER AND APPARATUS FOR VAPORIZING AND SUPPLYING

FIELD OF THE INVENTION

The present invention relates to a vaporizer and an apparatus for vaporizing and supplying that are employed for supplying a gaseous CVD material for a chemical vapor deposition (CVD) apparatus used in the manufacture of a semiconductor and the like. More particularly, it pertains to a vaporizer and an apparatus for vaporizing and supplying that are employed for supplying a liquid CVD material or a solution of a liquid CVD material of a solid CVD material in a solvent each at desirable concentration and flow rate in high efficiency for the apparatus used in the manufacture of a semiconductor.

BACKGROUND OF THE INVENTION

Recently in the field of semi-conductors, a lead titanate zirconate (PZT) film, a barium strontium titanate (BST) film, a tantalic acid strontium bismuth (SBT) film, a titanic acid zirconate lantern lead (PLZT) film, etc., each having a high dielectric constant and also a high step coverage has been used as an oxide-based dielectric film for a semiconductor memory. In regard to the CVD material for the foregoing thin films, for example, $Pb(DPM)_2$ (solid material) as a Pb source; $Zr\{OC(CH_3)_3\}_4$ (liquid material) and $Zr(DPM)_4$ (solid material) as Zr sources; $Ti\{OCH(CH_3)_2\}_4$ (liquid material) and $Ti(OCH (CH_3)_2)_2 (DPM)_2$ (solid material) as Ti sources; $Ba(DPM)_2$ (solid material) as a Ba source; and $Sr(DPM)_2$ (solid material) as a Sr source are employed.

A liquid material, when being used as a CVD material, is usually introduced into a vaporizer along with a carrier gas via a flow rate controller, and the mixed gas is made into a gaseous form in the vaporizer and thereafter is fed to a CVD apparatus. However, it is difficult to vaporize a liquid material at a desirable concentration and flow rate in high efficiency without deteriorating the quality thereof, since the liquid material has usually a low vapor pressure, a high viscosity and a vaporizing temperature close to a decomposing temperature.

A solid material, although being capable of assuring highly pure material by being kept at an elevated temperature to sublime itself, makes it extremely difficult to assure sufficient supply amount in an industrial scale. Thus, in general it is dissolved in a solvent such as tetrahydrofuran to make it into a liquid material so as to vaporize. However, since a solid material has a vaporizing temperature greatly different from that of a solvent, a solvent alone is more apt to vaporize by heating, thereby making it more difficult to vaporize a liquid material.

Such being the case, highly advanced technique is required for manufacturing an insulated thin film by using a material in liquid or solid form. Conversely, an insulated thin film having high quality and high purity is expectable by the use of a liquid material or solid material. Accordingly, a variety of vaporizers and apparatuses for vaporizing and supplying have been developed for the purpose of efficiently vaporizing the aforesaid material without deteriorating the quality thereof.

For example, U.S. Pat. No. 6,473,563 B proposes a vaporizer wherein at least a portion of a CVD material feed portion in contact with a CVD material is constituted of a corrosion resistant synthetic resin; and an apparatus for vaporizing and supplying which comprises a cooler and the vaporizer wherein the inside of the CVD material feed portion of the vaporizer and the surface on the side of the vaporization chamber of the CVD material feed portion are constituted of a corrosion resistant synthetic resin; the feed portion in contact with the outside of the vaporizer is constituted of a metal; and the CVD material feed portion which is constituted of a metal and which undergoes heat transfer from the heating means upon heating the vaporization chamber can be cooled with a cooler. It is a vaporizer in which at least a portion of the CVD material feed portion in contact with the CVD material is constituted of a corrosion resistant synthetic resin which has not only heat resistance but also heat insulating property and characteristics of less liability to adhesion of the CVD material.

The use of the foregoing vaporizer enabled, even in the case of using a solid CVD material dissolved in an organic solvent as a CVD material, only the material to be vaporized with an efficiency of 99.9% or higher because any abrupt heating was prevented without generating any deposit of the material accompanied with adhesion thereof. In addition, the foregoing apparatus for vaporizing and supplying is equipped with a mechanism for cooling the CVD material feed portion at the time of heating the vaporization chamber, and the apparatus was least liable to the adhesion of deposits.

However, although the foregoing vaporizer and apparatus for vaporizing and supplying have effects of preventing the generation of any deposit of the solid CVD material accompanied with adhesion inside the CVD material supplier, a decrease in a feed amount of a carrier gas to be supplied accompanying the CVD material brings about such disadvantage that a solvent alone is vaporized, in the same manner as the conventional vaporizers, thus causing an anxiety of a solid CVD material to be more prone to be deposited in the vaporizer. On the contrary, it is desirable to improve use efficiency by supplying the CVD material having high concentration in chemical vapor deposition.

OBJECTS AND SUMMARY OF THE INVENTION

In such circumstances, an object of the present invention is to provide, even in the case of vaporizing and supplying with a decrease in a feed amount of a carrier gas to be supplied accompanying the CVD material employing a solid CVD material, a vaporizer and an apparatus for vaporizing and supplying which comprises the aforesaid vaporizer, which is capable of efficiently vaporizing a CVD material with a desirable concentration and flow rate without causing deposit or adhesion of the solid material in the CVD material feed port. Other objects of the present invention will become obvious from the text of this specification hereinafter disclosed.

Under such circumstances, the present inventors accumulated intensive extensive research and development in order to solve the above-described problems involved in the prior arts. As a result, the following has been found. Specifically, by providing a pressure loss-inducing portion in a CVD material feed portion or between a liquid flow controller and a vaporizer, it is made possible to reduce and stabilize both the pressure fluctuation in the vaporizer and the flow rate fluctuation in the liquid flow controller and to prevent deposit of the solid CVD material less liable to adhere even if such deposit is generated. Thus, the present invention has been accomplished by the foregoing findings and information.

That is to say, the present invention provides a vaporizer comprising a vaporization chamber for a CVD material, a CVD material feed portion supplying the CVD material for the vaporization chamber, a vaporized gas exhaust port and a heating means for heating the vaporization chamber, characterized in that the CVD material feed portion has passageways for the CVD material and for a carrier gas respectively and the passageway for the CVD material has a pressure loss-inducing means for the CVD material.

At the same time, the present invention provides an apparatus for vaporizing and supplying that feeds a CVD material to a vaporizer via a liquid flow controller, and after vaporizing the CVD material that supplies the vaporized gas for a semiconductor production apparatus, characterized in having a pressure loss-inducing means for the CVD material between the liquid flow controller and the vaporizer.

DESCRIPTION OF THE PREFERRED EMBODIMENTS

Figure 1:
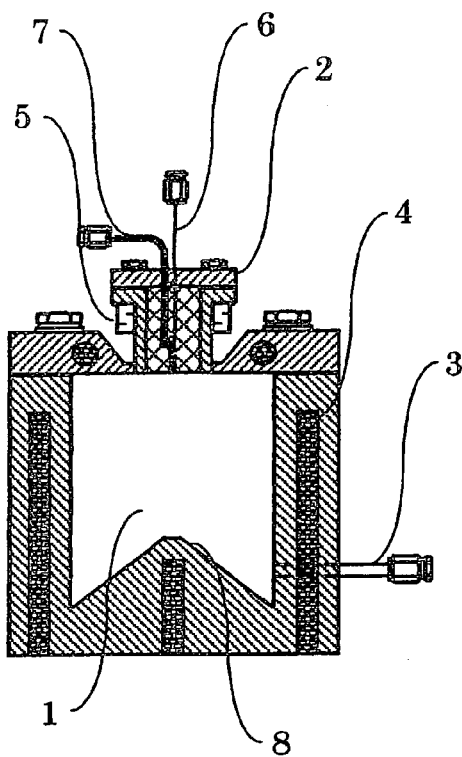
FIG. 1 is a vertical cross-sectional view showing one embodiment of a vaporizer according to the present invention.

The present invention is applied to a vaporizer which vaporizes a liquid CVD material or a liquid CVD material made up of a solution of a solid CVD material in a solvent, and which supplies a CVD apparatus or the like with a vaporized gas. In the case of a decrease in a feed amount of a carrier gas to be supplied accompanying the CVD material employing a solid CVD material, the vaporizer exhibits its effect particularly in view of the capability of reducing and stabilizing both the pressure fluctuation in the vaporizer and the flow rate fluctuation in the liquid flow controller and the capability of preventing the deposit and adhesion of a solid CVD material inside the vaporizer.

The vaporizer according to the present invention is a vaporizer in which the CVD material feed portion has passageways for the CVD material and for a carrier gas respectively and the passageway for the CVD material has a pressure loss-inducing means for the CVD material. Further, the apparatus for vaporizing and supplying according to the present invention is an apparatus for vaporizing and supplying having a pressure loss-inducing means for the CVD material between the liquid flow controller and the vaporizer.

The CVD material to which are applicable the vaporizer and the apparatus for vaporizing and supplying is not specifically limited, provided that the CVD material can be kept in liquid state whether it is in liquid state at ordinary temperature or a solution of a solid dissolved in a solvent. The CVD material is properly and optionally selected for a use according to the purpose of the use.

Examples thereof include an alkoxide in liquid state at ordinary temperature such as tetraisopropoxytitanium (Ti(OCH($CH_3$)$_2$)$_4$), tetra-n-propoxytitanium (Ti(OCH$_3$H$_7$)$_4$), tetra-tert-butoxyzirconium (Zr(OC(C$_3$)$_3$)$_4$), tetra-n-butoxyzirconium (Zr(OC$_4$H$_9$)$_4$), tetramethoxyvanadium (V(OCH$_3$)$_4$), trimethoxyvanadyloxide (VO(OCH$_3$)$_3$), pentaethoxyniobium (Nb(OC$_2$H$_5$)$_5$), pentaethoxytantalum (Ta(OC$_2$H$_5$)$_5$), trimethoxyboron (B(OCH$_3$)$_3$), triisopropoxyaluminum (Al(OCH(CH$_3$)$_2$)$_3$), tetraethoxysilicon (Si(OC$_2$H$_5$)$_4$), tetraethoxygermanium (Ge(OC$_2$H$_5$)$_4$), tetraethoxytin (Sn(OCH$_3$)$_4$), trimethoxyphosphorus (P(OCH$_3$)$_3$), trimethoxyphosphineoxide (PO(OCH$_3$)$_3$), triethoxyarsenic (As(OC$_2$H$_5$)$_3$) and triethoxyantimony (Sb(OC$_2$H$_5$)$_3$).

Examples of the CVD material in liquid state at ordinary temperature other than the foregoing examples include trimethylaluminum (Al(CH$_3$)$_3$), dimethylaluminumhydride (Al(CH$_3$)$_2$)H), triisobutylaluminum (Al(iso-C$_4$H$_9$)$_3$), hexafluoroacetylacetonecopper vinyltrimethylsilane ((CF$_3$CO)$_2$CHC$_u$·CH$_2$CHSi(CH$_3$)$_3$), hexafluoroacetylacetonecopper allyltrimethylsilane ((CF$_3$CO)$_2$CHC$_u$·CH$_2$CHCH$_2$Si(CH$_3$)$_3$), bis(isopropylcyclopentadienyl)tungsten dihydride ((iso-C$_3$H$_7$C$_5$H$_5$)$_2$WH$_2$), tetradimethylaminozirconium (Zr(N(CH$_3$)$_2$)$_4$), pentadimethylaminotantalum (Ta(N(CH$_3$)$_2$)$_5$), pentadiethylaminotantalum (Ta(N(C$_2$H$_5$)$_2$)$_5$), tetradimethylaminotitanium (Ti(N(CH$_3$)$_2$)$_4$) and tetradiethylaminotitanium (Ti(N(C$_2$H$_5$)$_2$)$_4$).

Further, examples of the CVD material in solid state at ordinary temperature include hexacarbonylmolybdenum (Mo(CO)$_6$), dimethylpenthoxygold (Au(CH$_3$)$_2$(OC$_5$H$_7$)), bismuth (III) tertiallybuthoxyd (Bi(OtBu)$_3$), bismuth (III) tertiallypenthoxyd (Bi(OtAm)$_3$), triphenylbismuth (BiPh$_3$), bis(ethylcyclopentadienyl)ruthenium(Ru(EtCp)$_2$), (ethylcyclopentadienyl) (trimethyl) platinum (Pt(EtCp)Me$_3$), 1,5-cyclooctadiene (ethylcyclopentadienyl) iridium (Ir(EtCp)(cod)), bis(hexaethoxytantalum) strontium (St[Ta(OEt)$_6$]$_2$), bis(hexaisopropoxytantalum) strontium (St[Ta(OiPr)$_6$]$_2$), tris(2,2,6,6,-tetramethyl-3,5 heptanedionite) lanthanum (La(DPM)$_3$), tris(2,2,6,6,-tetramethyl-3,5 heptanedionite) yttrium (Y(DPM)$_3$), tris(2,2,6,6,-tetramethyl-3,5 heptanedionite) ruthenium (Ru(DPM)$_3$), bis(2,2,6,6,-tetramethyl-3,5 heptanedionite) barium (Ba(DPM)$_2$), bis(2,2,6,6,-tetramethyl-3,5 heptanedionite) strontium (Sr(DPM)$_2$), tetra(2,2,6,6,-tetramethyl-3,5 heptanedionite) titanium (Ti(DPM)$_4$), tetra(2,2,6,6,-tetramethyl-3,5 heptanedionite) zirconium (Zr(DPM)$_4$), tetra(2,6,-dimethyl-3,5 heptanedionite) zirconium (Zr(DMHD)$_4$), bis(2,2,6,6,-tetramethyl-3,5 heptanedionite) lead (Pb(DPM)$_2$), (ditertiallybuthoxy) bis(2,2,6,6,-tetramethyl-3.5. heptanedionite) titanium (Ti(OtBu)$_2$(DPM)$_2$), (di-isopropoxy) bis(2,2,6,6,-tetramethyl-3,5,-heptanedionite) titanium (Ti(OiPr)$_2$(DPM)$_2$), (isopropoxy) tris(2,2,6,6,-tetramethyl-3,5,-heptanedionite) zirconium (Zr(OiPr)(DPM)$_3$), (di-isopropoxy) tris(2,2,6,6,-tetramethyl-3,5,-heptanedionite) tantalum (Ta(OiPr)$_2$(DPM)$_3$). The above-exemplified materials need to be dissolved in an organic solvent in a concentration of usually 0.1 to 1.0 mol/liter, approximately.

The above-mentioned organic solvent to be used as a solvent for a solid CVD material is that having a boiling point usually ranging from 40° C. to 140° C. Examples of the solvent include such ethers as propyl ether, methylbutyl ether, ethylpropyl ether, ethylbutyl ether, trimethylene oxide, tetrahydrofuran and tetrahydropyran; alcohols such as methyl alcohol, ethyl alcohol, propyl alcohol and butyl alcohol; ketones such as acetone, ethylmethylketone, isopropylmethylketone and iso-butylmethylketone; amines such as propylamine, butylamine, diethylamine, dipropylamine and triethylamine; esters such as ethyl acetate, propyl acetate and butyl acetate; and hydrocarbons such as hexane, heptane and octane.

In the following, detailed description will be given of the vaporizer and the apparatus for vaporizing and supplying according to the present invention with reference to FIGS. 1 to 8, which however shall never limit the present invention thereto.

Figure 2:
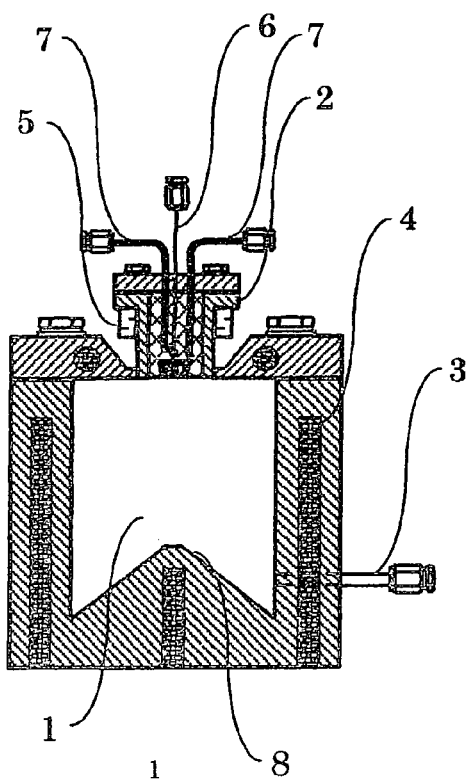
FIG. 2 is a vertical cross-sectional view showing another embodiment of a vaporizer according to the present invention.
Figure 3:
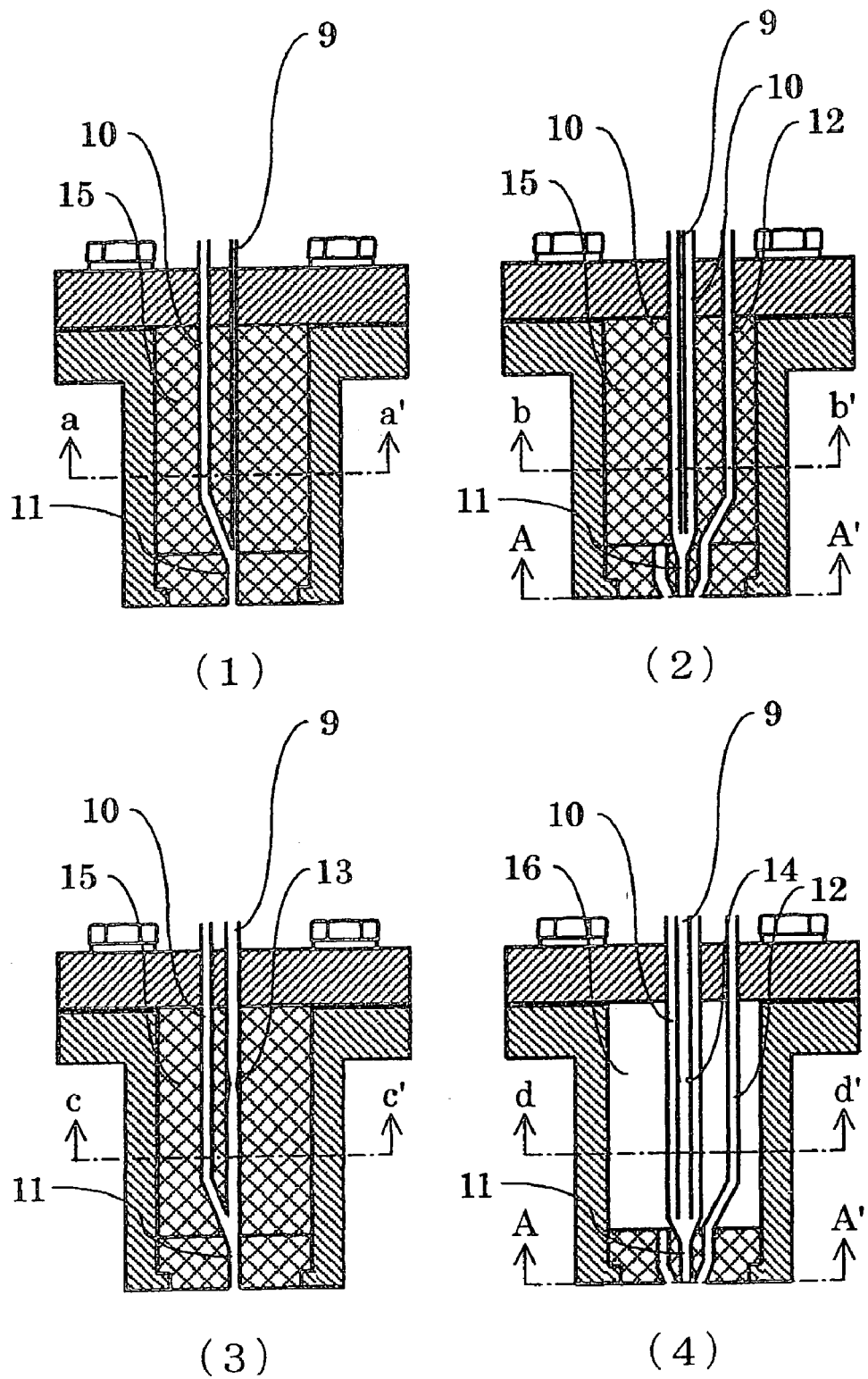
FIGS. 3(1) to (6) each is a vertical cross-sectional view showing embodiments of a CVD material feed portion according to the present invention.
Figure 3:
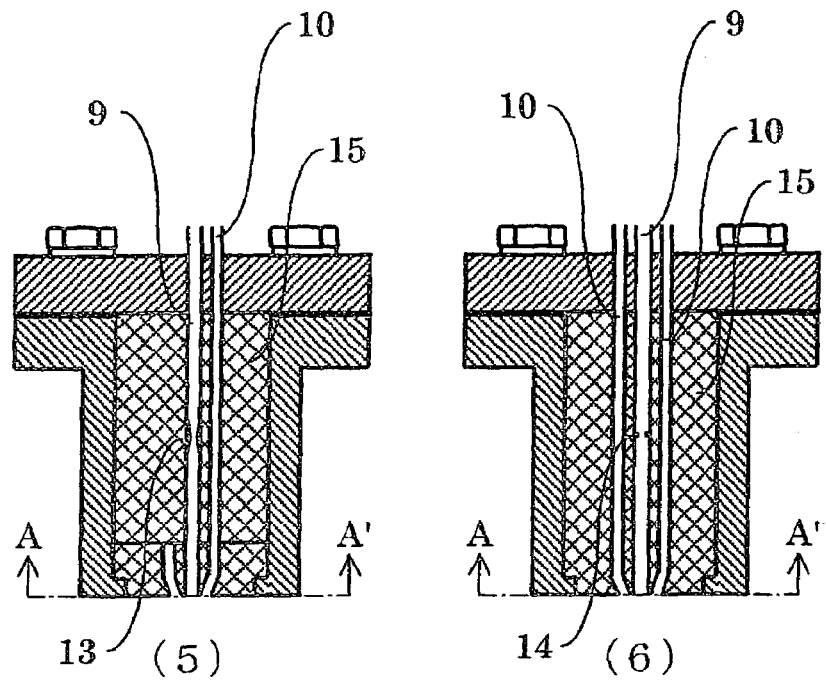
Figure 4:
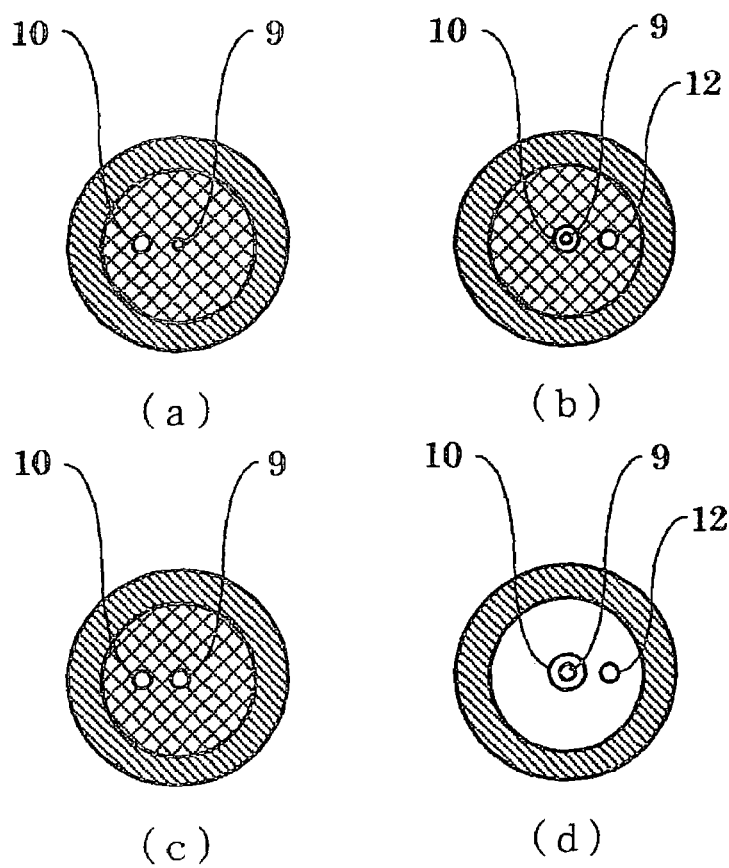
FIGS. 4(a) to (d) each is a horizontal cross-sectional view of a–a' face, b–b' face, c–c' face, and d–d' face of (1) to (4) respectively in FIG. 3.
Figure 5:
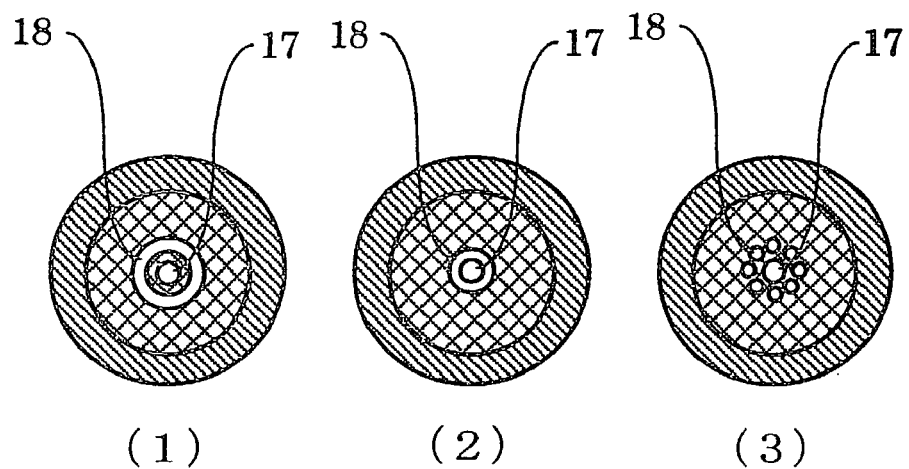
FIGS. 5(1) to (3) each is a horizontal cross-sectional view of A–A' face (a surface of exhausting a CVD material and a carrier gas to a vaporizing chamber) in FIG. 3.
Figure 6:
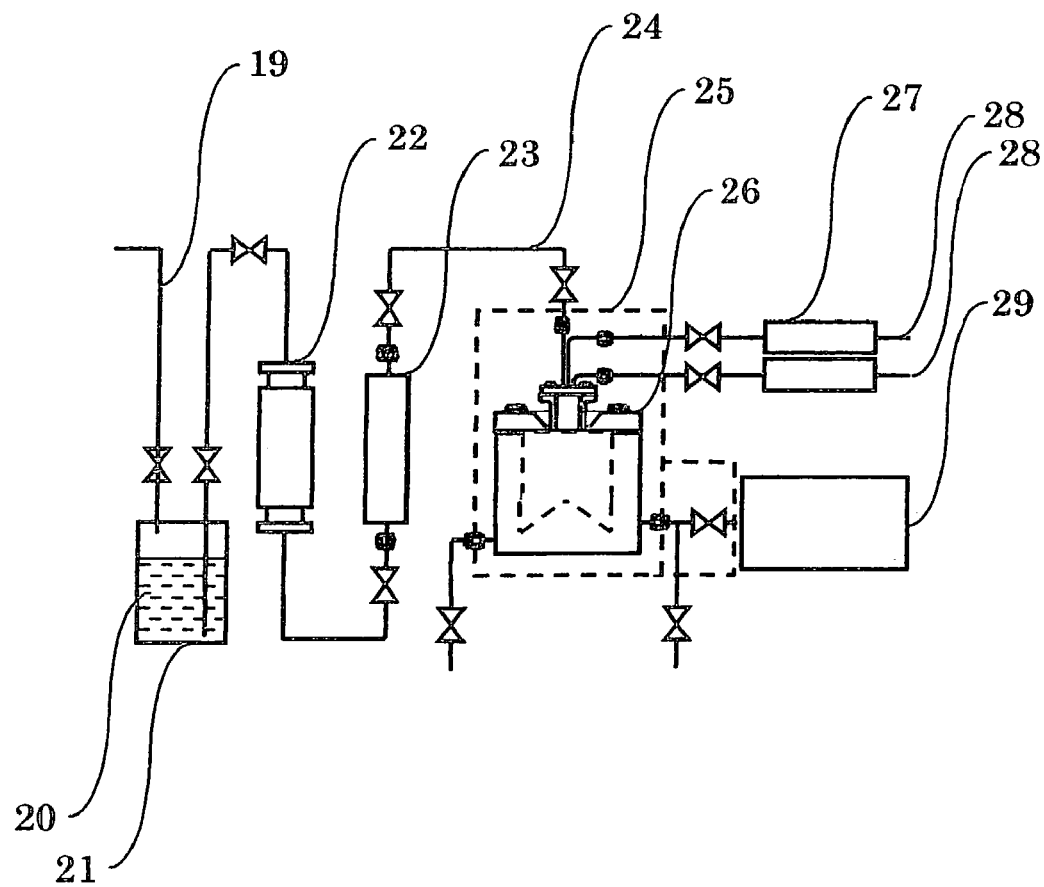
FIG. 6 is a schematic flow diagram illustrating one embodiment of the constitution of an apparatus for vaporizing and supplying according to the present invention.
Figure 7:
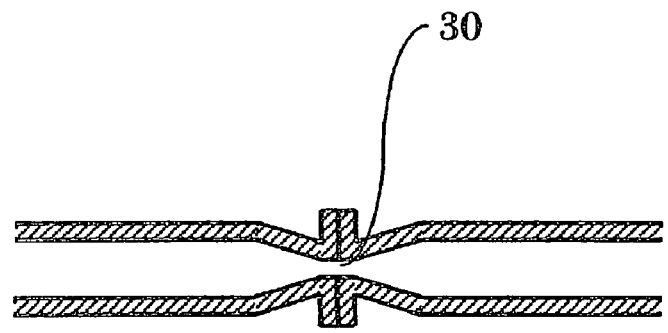
FIGS. 7(1) and (2) each is a vertical cross-sectional view illustrating an embodiment of a throttle portion and an orifice respectively in the present invention.
Figure 8:
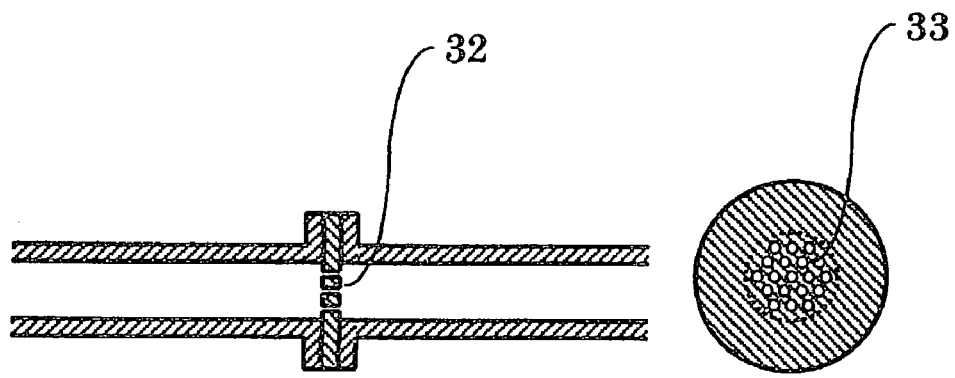
FIG. 8 is a vertical cross-sectional view illustrating an embodiment of a filter in the present invention.

FIGS. 1 and 2 are vertical cross-sectional views showing embodiments of vaporizers according to the present invention; FIGS. 3(1) to (6) each is a vertical cross-sectional view showing embodiments of a CVD material feed portion according to the present invention; FIGS. 4(a) to (d) each is a horizontal cross-sectional view of a–a' face, b–b' face, c–c' face, and d–d' face of (1) to (4) respectively in FIG. 3; FIGS. 5(1) to (3) each is a horizontal cross-sectional view of A–A' face (a surface of exhausting a CVD material and a carrier gas to a vaporizing chamber) in FIG. 3; FIG. 6 is a schematic flow diagram illustrating one embodiment of the constitution of an apparatus for vaporizing and supplying according to the present invention; FIGS. 7(1) and (2) each is a vertical cross-sectional view illustrating an embodiment of a throttle portion and an orifice respectively in the present invention; and FIG. 8 is a vertical cross-sectional view illustrating an embodiment of a filter in the present invention As shown in FIGS. 1 and 2, the vaporizer according to the present invention comprises a vaporization chamber 1 for a CVD material, a CVD material feed portion 2 supplying the CVD material for the vaporization chamber, a vaporized gas exhaust port 3 and a heating means 4 (heater or the like) for heating the vaporization chamber. Further, it is desirable for the vaporizer of the present invention to be equipped with a cooling means 5 for the CVD material feed portion. An example of such a cooling means include a pipe that provides cooling water along the side surface of the CVD material feed portion, etc.

As shown in FIGS. 1 and 2, the vaporizer of the present invention is designed so that a CVD material feed pipe 6 and a carrier gas feed pipe 7 are connected from outside of the vaporizer to the CVD material feed portion of the vaporizer. The CVD material feed portion comprises a CVD material passageway 9 and a carrier gas passageway 10 that are connected to the foregoing feed pipes as shown in FIG. 3. These two passageways have the structure that forms a mixing passageway 11 by joining in a manner such as shown in FIG. 3, thereby exhausting the CVD material and the carrier gas to the vaporizing chamber. In the vaporizer of the present invention, a pressure loss-inducing means for the CVD material is attached to CVD material passageway 9.

Further, it is preferable for the vaporizer of the present invention to have another carrier gas passageway 12 that exhaust the carrier gas to the vaporizing chamber from the outer peripheral of an outlet of the mixing passageway 11 as illustrated in FIGS. 3, (2) and (4). Furthermore, it is desirable for the exhaust outlet of the carrier gas passageway 12 to be settled in a manner that the direction of the exhaust is slanted toward the exhaust outlet of the mixing passageway 11 to the vaporizing chamber. By the application of the foregoing structure of the CVD material feed portion, a vaporizing efficiency of the vaporizer becomes extremely superior because both the pressure fluctuation in the vaporization chamber and the flow rate fluctuation in the liquid mass flow controller at the timing of vaporizing and supplying decrease less and less, and at the same time, the deposit or adhesion of the solid CVD material in the vaporization chamber is also further reduced.

Specific examples of the pressure loss-inducing means provided in CVD material passageway 9 in the vaporizer of the present invention include a capillary with a inner diameter smaller than the inner diameter of mixing passageway 11 for the CVD material and the carrier gas as shown in FIGS. 3, (1) and (2), a throttle portion 13 or an orifice 14, etc., as shown in FIGS. 3, (3) to (6). It is preferable for any of the foregoing pressure loss-inducing means in the vaporizer of the present invention to cause a pressure loss in the CVD material of at least 90% of the total pressure in the CVD material feed portion.

In the case where the capillary is employed as the pressure loss-inducing means for the CVD material, although the inner diameter of the capillary is not particularly specified on the assumption that it is smaller than the inner diameter of the mixing passageway, it is usually equal to or less than 50% of the inner diameter of the mixing passageway, and is smaller than 0.2 mm. Regarding the length of the capillary, it should be made longer in proportion that the inner diameter of the capillary becomes large, and it is usually at least 2 cm, or equal to the total length of the whole CVD material passageway, if necessary. The capillary might be employed as CVD material feed pipe 6 illustrated in FIG. 1.

Further, in the case where the throttle portion or the orifice is employed as the pressure loss-inducing means for the CVD material, although the aperture of the throttle portion or the orifice is not particularly specified, it is usually equal to or less than 30% of the inner diameter of the mixing passageway, and is smaller than 0.1 mm. Additionally, there are no specialized positions where the foregoing capillary, throttle portion or orifice should be attached in the CVD material passageways. However, the positions are desirably selected at where any blockage would not occur except at an exhaust port of the vaporizing chamber. Two or more of them can be employed and they can be employed in combination.

Furthermore, synthetic resin such as fluororesin or polyimide based resin, or a cavity is preferably applied as the inner surface of the CVD material feed portion in the vaporizer of the present invention. With regards to a material of construction for contacting with the outside of the vaporizer, metals such as carbon steel, manganese steel, chromium steel, molybdenum steel, stainless steel and nickel steel are preferable. In the case where the inside of the CVD material feed portion is constituted of a synthetic resin, the synthetic resin 15 is deployed as illustrated in FIGS. 3, (1), (2), (3), (5) and (6). Further, in the case where the inside of the CVD material feed portion is constituted of a cavity, the cavity 16 is formed as shown in FIG. 3, (4). By the application of the foregoing structure of the CVD material feed portion, even in the case of employing a solid CVD material dissolved in an organic solvent as the CVD material, any vaporization of only the solvent in a passageway induced by an abrupt elevation of the temperature caused by such a heating device as a heater can be prevented.

The apparatus for vaporizing and supplying according to the present invention feeds a CVD material to a vaporizer via a liquid flow controller, and after vaporizing the CVD material, supplies the vaporized gas for a semiconductor production apparatus, and is comprising degassing unit 22, liquid flow controller 23 such as mass flow controller, vaporizer 26 and carrier gas feed line 28, etc., as illustrated in FIG. 6. In FIG. 6, use is made as illustrated therein, of a liquid CVD material vessel 21 containing a liquid CVD material 20, a liquid flow controller 23, a vaporizer 26, a semiconductor manufacturing apparatus 29, and preferably a degassing unit 22. Further, the apparatus for vaporizing and supplying according to the present invention is an apparatus for vaporizing and supplying having a pressure loss-inducing means for the CVD material between the liquid flow controller and the vaporizer.

Specific examples of the pressure loss-inducing means for the CVD material provided between the liquid flow controller and the vaporizer in the apparatus for vaporizing and supplying according to the present invention include a capillary with a inner diameter smaller than the inner diameter of a CVD material passageway in the vaporizer at least among pipe 24 between the liquid flow controller and the vaporizer, a throttle portion 30 or an orifice 31, among the pipe 24 as shown in FIG. 7, or a filter 32 among the pipe 24 as shown in FIG. 8, etc. It is preferable for any of the foregoing pressure loss-inducing means in the apparatus for vaporizing and supplying of the present invention to cause a pressure loss in the CVD material of at least 90% of the total pressure between a CVD material vessel and the vaporizer. Further, the pressure loss-inducing means for the CVD material can be provided both in the CVD material passageway of the foregoing vaporizer and between the liquid flow controller and the vaporizer. Even in these cases, it is preferable for both of the foregoing pressure loss-inducing means to cause a pressure loss in the CVD material of at least 90% of the pressure between the CVD material vessel and the CVD material feed portion of the vaporizer.

In the case where the capillary is employed as the pressure loss-inducing means for the CVD material, although the inner diameter of the capillary is not particularly specified on the assumption that it is smaller than the inner diameter of the CVD material passageway in the CVD material feed portion of the vaporizer, it is usually equal to or less than 50% of the inner diameter of the CVD material passageway, and is smaller than 0.2 mm. Regarding the length of the capillary, it should be made longer in proportion that the inner diameter of the capillary becomes large, and it is usually at least 2 cm. The capillary might be employed as the whole pipes between the liquid flow controller and the vaporizer, depending on the necessity.

Further, in the case where the throttle portion or the orifice is employed as the pressure loss-inducing means for the CVD material, although the aperture of the throttle portion or the orifice is not particularly specified, it is usually equal to or less than 30% of the inner diameter of the pipe between the liquid flow controller and the vaporizer, and is smaller than 0.1 mm.

In the case where the filter is employed as the pressure loss-inducing means for the CVD material, although the material for the filter is not particularly specified as far as it has an anticorrosion property, porous filters made of sintered metals, ceramics, fluororesins, etc. are usually employed as the filter. Furthermore, it is preferable for the filter to be able to remove particles having diameters corresponding to 0.01 μm with the rejection rate of 99.99% or more, and it is more preferable for the filter to be able to remove particles having diameters corresponding to 0.001 μm with the rejection rate of 99.99% or more.

Typical examples of the filters on the market that can be employed as the foregoing filters include the porous filters (SLF-E, SLF-L, SLF-M and SLF-X all available from Japan Pionics Co., Ltd.) made of stainless steel and the porous filters (XLF-D, XLF-E, XLF-L and XLF-M all available from Japan Pionics Co., Ltd.) made of Teflon membrane.

Additionally, two or more of the foregoing capillary, throttle portion, orifice or filter can be employed and they can be used in combination.

This invention will be described in further detail with reference to Examples, which does not limit the scope of this invention.

EXAMPLES

Example 1

There was prepared a CVD material feed portion having the passageways as illustrated in FIG. 3 (1) in which the inside thereof was constituted of a fluororesin (PFA), and the portion in contact with the outside of the vaporizer was constituted of stainless steel (SUS316). The PFA made portion was a column having an outside diameter of 16 mm and a height of 34.2 mm. The stainless steel outside the column had a thickness of 2.0 mm. The CVD material feed portion had such constitution that the CVD material passageway and the carrier gas passageway were stainless steel pipes, and the mixing passageway for the CVD material and the carrier gas connected to the vaporization chamber was constituted of a fluororesin (PFA). The CVD material passageway was a capillary having an inside diameter of 0.1 mm, the inside diameters of the carrier gas passageway and the mixing passageway for the CVD material and the carrier gas were 1.8 mm and 0.25 mm respectively. Further, a junction joining the CVD material and the carrier gas was settled to be 5 mm upward from the basement of the CVD material feed portion. Additionally, a cooling pipe that provides cooling water along the side surface of the CVD material feed portion was equipped as a cooling means for the CVD material feed portion. There was also prepared, in addition to the foregoing CVD material feed portion, as illustrated in FIG. 1, a vaporizer which was made of SUS316 and incorporated with a vaporized gas exhaust port, a heating means for the vaporization chamber and a protrusion housing a heater. The vaporization chamber was in the form of a column having an inside diameter of 65 mm and a height of 92.5 mm and a protrusion height at the bottom of 27.5 mm. The vaporized gas exhaust port was placed at a height of 15 mm from the bottom of the vaporizer. Subsequently, a vaporizing and supplying system as illustrated in FIG. 6 was fabricated by connecting a degassing unit, a liquid mass flow controller, a carrier gas feed line and the like. Additionally, a stainless steel pipe having an inside diameter of 1.8 mm and a length of 10 cm was employed as the pipe between the liquid flow controller and the vaporizer.

A test for vaporizing and supplying was made in the following manner by the use of the foregoing apparatus. The vaporization chamber was set on 1.3 kPa (10 torr) and at the temperature of 250° C., the CVD material feed portion of the vaporizer was charged with a liquid CVD material having a concentration of 0.3 mol/liter in which $Zr(DPM)_4$ as a solid CVD material was dissolved in tetrahydrofuran (THF) as a solvent with a flow rate of 0.2 g/min and argon gas with a flow rate of 200 milliliter/min, and then the liquid CVD material was vaporized in the chamber. During the foregoing process, cooling water was supplied to maintain the temperature of the stainless steel of the a CVD material feed portion at 30±2° C.

After continuous test for vaporizing and supplying for ten hours, investigation was made on the state of adhesion of the solid CVD material in the passageway of the CVD material feed portion and in the vaporization chamber. As a result, no deposition or adhesion of the solid CVD material was recognized by the human observation. Accordingly, tetrahydrofuran (THF) was fed from the CVD material passageway and after washing away and recovering the solid CVD material adhered in the passageway of the CVD material feed portion and in the vaporization chamber, the amount of the adhesion of the solid CVD material obtained by the evaporation of tetrahydrofuran (THF) was weighed. The results are shown in Table 1. Further, the result of the measurement of both the pressure fluctuation in the vaporization chamber and the flow rate fluctuation in the liquid mass flow controller during the vaporizing and supplying test are shown in Table 1. Additionally, the averaged mean values of the greatest coefficient of fluctuation measured every five minutes were employed as the each value of the pressure fluctuation and the flow rate fluctuation.

Example 2

Example 2 was conducted by the use of the same apparatus for vaporizing and supplying as employed in Example 1 and a liquid CVD material having a concentration of 0.3 mol/liter in which $Pb(DPM)_2$ as a solid CVD material dissolved in tetrahydrofuran (THF) as a solvent was vaporized and supplied in the following manner. The vaporization chamber was set on 1.3 kPa (10 torr) and at the temperature of 210° C., and by feeding the CVD material with a flow rate of 0.36 g/min and argon gas with a flow rate of 300 milliliter/min, the liquid CVD material was vaporized in the chamber. During the foregoing process, cooling water was supplied to maintain the temperature of the stainless steel of the a CVD material feed portion at 30±2° C.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 3

Example 3 was conducted by the use of the same apparatus for vaporizing and supplying as employed in Example 1 and a liquid CVD material having a concentration of 0.3 mol/liter in which $Ti(OiPr)_2(DPM)_2$ as a solid CVD material was dissolved in tetrahydrofuran (THF) as a solvent was vaporized and supplied in the following manner. The vaporization chamber was set on 1.3 kPa (10 torr) and at the temperature of 230° C., and by feeding the CVD material with a flow rate of 0.2 g/min and argon gas with a flow rate of 100 milliliter/min, the liquid CVD material was vaporized in the chamber. During the foregoing process, cooling water was supplied to maintain the temperature of the stainless steel of the a CVD material feed portion at 30±2° C.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 4

There was prepared a CVD material feed portion for a vaporizer having the passageways as illustrated in FIG. 3(3) similarly as in Example 1 except that a pipe with an inside diameter of 0.25 mm having a throttle portion with an aperture of 0.05 mm was employed as CVD material passageway instead of the capillary. The same vaporizer as in Example 1 except the use of the foregoing CVD material feed portion was prepared, and an apparatus for vaporizing and supplying was fabricated by connecting a degassing unit, a liquid mass flow controller, a carrier gas feed line and the like as employed in Example 1. Example 4 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 5

There was prepared a CVD material feed portion having the passageways as illustrated in FIG. 3 (2) in which the inside thereof was constituted of a fluororesin (PFA), and the portion in contact with the outside of the vaporizer was constituted of stainless steel (SUS316). The fluororesin (PFA) made portion was a column having an outside diameter of 16 mm and a height of 34.2 mm. The stainless steel outside the column had a thickness of 2.0 mm. The CVD material feed portion had such constitution that the CVD material passageway and the neighboring carrier gas passageway were stainless steel double-structured pipes, and the mixing passageway for the CVD material and the other carrier gas passageway connected to the vaporization chamber were constituted of a fluororesin (PFA). The inner tube of the double-structured pipe was a capillary having an inside diameter of 0.1 mm and an outside diameter of 1.59 mm, the inside diameter and the outside diameter of the outer tube thereof were 1.8 mm and 3.18 mm respectively. The inside diameters of the mixing passageway and the outer carrier gas passageway were 0.25 mm and 1.8 mm respectively. A horizontal cross-sectional face of A–A' (a surface of exhausting a CVD material and a carrier gas to a vaporizing chamber in FIG. 3(2)) was formed as illustrated in FIG. 5(2). Further, a junction joining the CVD material and the carrier gas was settled to be 5 mm upward from the basement of the CVD material feed portion. Additionally, a cooling pipe that provides cooling water along the side surface of the CVD material feed portion was equipped as a cooling means for the CVD material feed portion. The same vaporizer as in Example 1 except the use of the foregoing CVD material feed portion was prepared, and an apparatus for vaporizing and supplying was fabricated by connecting a degassing unit, a liquid mass flow controller, a carrier gas feed line and the like as employed in Example 1. Example 5 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 6

In the preparation of the CVD material feed portion for the vaporizer described in Example 5, a CVD material feed portion as shown in FIG. 3(4) was prepared similarly as Example 5 except that having a cavity in itself and that a double-structured pipe including a tube having an inside diameter of 0.25 mm with an orifice having an aperture of 0.05 mm was employed as a CVD material passageway instead of the double-structured pipe including the capillary. The inside diameter of the outer tube of the double-structured pipe was 1.8 mm. The same vaporizer as in Example 1 except the use of the foregoing CVD material feed portion was prepared, and an apparatus for vaporizing and supplying was fabricated by connecting a degassing unit, a liquid mass flow controller, a carrier gas feed line and the like as employed in Example 1. Example 6 was conducted by the use of the foregoing apparatus for vaporizing and supplying and a liquid CVD-material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

On the other hand, another tests for vaporizing and supplying under the same condition confirmed that the pressure loss-inducing means for the CVD material caused a pressure loss in the CVD material of at least 90% of the total pressure in the CVD material feed portion in Examples 1 to 6.

Example 7

There was prepared a CVD material feed portion for a vaporizer having the passageways similarly as in Example 1 except that a pipe with an inside diameter of 0.25 mm was employed as CVD material passageway instead of the capillary. A vaporizer was prepared similarly as Example 1 except that the foregoing CVD material feed portion was employed. An apparatus for vaporizing and supplying as illustrated in FIG. 6 was fabricated by connecting a degassing unit, a liquid mass flow controller, a carrier gas feed line and the like as employed in Example 1 with the exception that a capillary made of stainless steel having an inside diameter of 0.1 mm and having a length of 10 cm was employed as a pipe between the liquid flow controller and the vaporizer. Example 7 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 8

Example 8 was conducted by the use of the same apparatus for vaporizing and supplying as employed in Example 7 and a liquid CVD material having a concentration of 0.3 mol/liter in which $Pb(DPM)_2$ as a solid CVD material was dissolved in tetrahydrofuran (THF) as a solvent was vaporized and supplied in the same manner as Example 2.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 9

Example 9 was conducted by the use of the same apparatus for vaporizing and supplying as employed in Example 7 and a liquid CVD, material having a concentration of 0.3 mol/liter in which $Ti(OiPr)_2(DPM)_2$ as a solid CVD material was dissolved in tetrahydrofuran (THF) as a solvent was vaporized and supplied in the same manner as Example 3.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 10

There was prepared an apparatus for vaporizing and supplying similarly as in Example 7 except that a pipe with an inside diameter of 1.8 mm and with a length of 10 cm having a throttle portion with an aperture of 0.05 mm was employed as CVD material passageway instead of the capillary employed as the pipe between the liquid flow controller and the vaporizer. Example 10 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 11

There was prepared an apparatus for vaporizing and supplying similarly as in Example 7 except that a pipe with an inside diameter of 1.8 mm and with a length of 10 cm having an orifice with an aperture of 0.05 mm was employed as CVD material passageway instead of the capillary employed as the pipe between the liquid flow controller and the vaporizer. Example 11 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Example 12

There was prepared an apparatus for vaporizing and supplying similarly as in Example 7 except that a pipe with an inside diameter of 1.8 mm and with a length of 10 cm having further a porous filter made of stainless steel (SLF-M, uniform particle removing rate of a particle having diameter of 0.01 μm: 99.9999999%, available from Japan Pionics Co., Ltd.) was employed as CVD material passageway instead of the capillary employed as the pipe between the liquid flow controller and the vaporizer. Example 12 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

On the other hand, another tests for vaporizing and supplying under the same condition confirmed that the pressure loss-inducing means for the CVD material caused a pressure loss in the CVD material of at least 90% of the total pressure in the CVD material feed portion in Examples 7 to 12.

Comparative Example 1

There was prepared a CVD material feed portion for a vaporizer having the passageways similarly as in Example 1 except that a pipe with an inside diameter of 0.25 mm was employed as CVD material passageway instead of the capillary. The same vaporizer as in Example 1 except the use of the foregoing CVD material feed portion was prepared, and an apparatus for vaporizing and supplying was fabricated by connecting a degassing unit, a liquid mass flow controller, a carrier gas feed line and the like as employed in Example 1. Comparative Example 1 was conducted by the use of the foregoing apparatus for vaporizing and supplying and a liquid CVD material having a concentration of 0.3 mol/liter in which $Zr(DPM)_4$ as a solid CVD material was dissolved in tetrahydrofuran (THF) as a solvent was vaporized and supplied in the same manner as Example 1.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Comparative Example 2

Comparative Example 2 was conducted by the use of the same apparatus for vaporizing and supplying as employed in Comparative Example 1 and a liquid CVD material having a concentration of 0.3 mol/liter in which $Pb(DPM)_2$ as a solid CVD material was dissolved in tetrahydrofuran (THF) as a solvent was vaporized and supplied in the same manner as Example 2.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

Comparative Example 3

Comparative Example 3 was conducted by the use of the same apparatus for vaporizing and supplying as employed in Comparative Example 1 and a liquid CVD material having a concentration of 0.3 mol/liter in which $Ti(OiPr)_2(DPM)_2$ as a solid CVD material was dissolved in tetrahydrofuran (THF) as a solvent was vaporized and supplied in the same manner as Example 3.

After continuous test for vaporizing and supplying for ten hours, the amount of the adhesion of the solid CVD material, both the pressure fluctuation in the vaporization chamber and the flow rate fluctuation in the liquid mass flow controller during the vaporizing and supplying test were obtained in the same manner as Example 1. The results are shown in Table 1.

TABLE 1

| | CVD Material | Pressure loss-inducing means | | Adhered CVD Material (mg) | Pressure Fluctuation (%) | Flow Rate Fluctuation (%) |
| --- | --- | --- | --- | --- | --- | --- |
| | | Application | Means | | | |
| Ex. 1 | $Zr(DPM)_4$ | Vaporizer | Capillary | 20 | 1.1 | 1.2 |
| Ex. 2 | $Pb(DPM)_2$ | Vaporizer | Capillary | 45 | 0.9 | 1.1 |
| Ex. 3 | $Ti(OiPr)_2(DPM)_2$ | Vaporizer | Capillary | 7 | 0.7 | 1.1 |
| Ex. 4 | $Zr(DPM)_4$ | Vaporizer | Throttle portion | 22 | 0.9 | 0.9 |
| Ex. 5 | $Zr(DPM)_4$ | Vaporizer | Capillary | 18 | 0.7 | 0.8 |
| Ex. 6 | $Zr(DPM)_4$ | Vaporizer | Orifice | 15 | 0.8 | 0.9 |
| Ex. 7 | $Zr(DPM)_4$ | Apparatus | Capillary | 25 | 1.5 | 1.8 |
| Ex. 8 | $Pb(DPM)_2$ | Apparatus | Capillary | 56 | 1.7 | 2.1 |
| Ex. 9 | $Ti(OiPr)_2(DPM)_2$ | Apparatus | Capillary | 8 | 1.6 | 2.2 |
| Ex. 10 | $Zr(DPM)_4$ | Apparatus | Throttle portion | 22 | 1 | 1.7 |

TABLE 1-continued

| | CVD Material | Pressure loss-inducing means | | Adhered CVD Material (mg) | Pressure Fluctuation (%) | Flow Rate Fluctuation (%) |
| | | Application | Means | | | |
|---|---|---|---|---|---|---|
| Ex. 11 | Zr(DPM)$_4$ | Apparatus | Orifice | 27 | 1.4 | 2 |
| Ex. 12 | Zr(DPM)$_4$ | Apparatus | Filter | 29 | 2.5 | 2.8 |
| Com. Ex. 1 | Zr(DPM)$_4$ | — | — | 192 | 6.2 | 10.1 |
| Com. Ex. 2 | Pb(DPM)$_2$ | — | — | 283 | 6.5 | 11.2 |
| Com. Ex. 3 | Ti(OiPr)$_2$(DPM)$_2$ | — | — | 86 | 6 | 9.8 |

According to the present invention, even in the case of vaporizing and supplying with a decrease in a feed amount of a carrier gas to be supplied accompanying the CVD material employing a solid CVD material, a vaporizer and an apparatus for vaporizing and supplying, which is capable of reducing and stabilizing both the pressure fluctuation in the vaporizer and the flow rate fluctuation in the liquid flow controller and efficiently vaporizing a CVD material at a desirable concentration and flow rate without causing deposit or adhesion of the solid material in the vaporization chamber are provided. As a result, it became possible to improve use efficiency by supplying the CVD material with high concentration in chemical vapor deposition, etc.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A vaporizer which comprises a vaporization chamber for a CVD material, a CVD material feed portion supplying the CVD material for the vaporization chamber, and a vaporized gas exhaust port and a heating means for heating the vaporization chamber,
wherein said CVD material feed portion comprises passageways for said CVD material and for a carrier gas respectively and the passageway for said CVD material comprises a pressure loss-inducing means for said CVD material,
wherein said CVD material feed portion comprises passageways for said CVD material and for a carrier gas and a mixing passageway for joining the foregoing passageways and for connecting to said vaporization chamber;
wherein said CVD material feed portion further comprises a passageway exhausting said carrier gas from the outer peripheral of an outlet of said mixing passageway to said vaporizing chamber;
wherein said pressure loss-inducing means for said CVD material causes a pressure loss in the CVD material of at least 90% of the total pressure in said CVD material feed portion;
wherein said pressure loss-inducing means for said CVD material is a throttle portion or an orifice in said passageway for said CVD material; and
wherein an aperture of said throttle portion or said orifice is 0.1 mm or smaller.

2. An apparatus for vaporizing and supplying that feeds a CVD material to a vaporizer via a liquid flow controller, and after vaporizing said CVD material that supplies vaporized gas for a semiconductor production apparatus, comprising a pressure loss-inducing means for said CVD material between said liquid flow controller and the vaporizers,
wherein said pressure loss-inducing means for said CVD material causes a pressure loss in the CVD material of at least 90% of the pressure between a CVD material vessel and said vaporizer wherein said pressure loss-inducing means for said CVD material is a throttle portion or an orifice; and
wherein an aperture of said throttle portion or said orifice is 0.1 mm or smaller.

* * * * *